(12) United States Patent
Lin et al.

(10) Patent No.: US 12,471,507 B2
(45) Date of Patent: Nov. 11, 2025

(54) MEMORY DEVICE AND FABRICATION METHOD THEREOF

(71) Applicant: Taiwan Semiconductor Manufacturing Company, Ltd., Hsinchu (TW)

(72) Inventors: Yu-Chao Lin, Hsinchu (TW); Tung-Ying Lee, Hsinchu (TW); Shao-Ming Yu, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 622 days.

(21) Appl. No.: 17/857,023

(22) Filed: Jul. 3, 2022

(65) Prior Publication Data

US 2024/0008375 A1    Jan. 4, 2024

(51) Int. Cl.
*H10N 70/20*    (2023.01)
*H10B 63/00*    (2023.01)
*H10N 70/00*    (2023.01)

(52) U.S. Cl.
CPC .......... *H10N 70/231* (2023.02); *H10B 63/84* (2023.02); *H10N 70/021* (2023.02); *H10N 70/063* (2023.02); *H10N 70/841* (2023.02); *H10N 70/8828* (2023.02)

(58) Field of Classification Search
CPC .. H10N 70/231; H10N 70/021; H10N 70/063; H10N 70/841; H10N 70/8828; H10N 70/023; H10N 70/826; H10B 63/84; H10B 63/80; H10B 63/10
See application file for complete search history.

(56) References Cited

U.S. PATENT DOCUMENTS

| | | | |
|---|---|---|---|
| 6,566,700 B2 * | 5/2003 | Xu .................... | H10N 70/826 257/77 |
| 9,419,212 B2 * | 8/2016 | Petz et al. ............ | H10N 70/882 |
| 10,283,707 B2 * | 5/2019 | Kamata ................ | H10N 70/826 |
| 2020/0295083 A1 * | 9/2020 | Cheng ................ | H10N 70/826 |
| 2022/0045128 A1 * | 2/2022 | Cheng ................ | H10N 70/841 |
| 2022/0085291 A1 * | 3/2022 | Ode .................... | H10N 70/826 |
| 2022/0209105 A1 * | 6/2022 | Brew et al. ........ | G11C 13/0069 |

* cited by examiner

*Primary Examiner* — Christine S. Kim
*Assistant Examiner* — Nathalie R Fayette
(74) *Attorney, Agent, or Firm* — JCIPRNET

(57) ABSTRACT

A memory device and a fabrication method thereof are provided. The memory device includes a substrate, a seed layer over the substrate, a superlattice structure in contact with the seed layer and a top electrode over the superlattice structure. The seed layer comprises carbon and silicon. The superlattice structure comprises first metal layers and second metal layers stacked alternately.

20 Claims, 20 Drawing Sheets

MEMORY DEVICE AND FABRICATION METHOD THEREOF

BACKGROUND

Phase change memory (PCM) is a type of non-volatile memory in which the state of a function area in the phase change material is switched between crystalline and amorphous, e.g., by a current flow that generates heat. The state of the function area is then used to represent the stored data. Generally speaking, in the PCM, after the current passes through the bottom electrode, the bottom electrode generates thermal energy, and the thermal energy causes the PCM to switch between the crystalline state and the amorphous state. For example, after a heat excitation if the function area is in the crystalline state, the stored data is a low logic level. But if the function area is in the amorphous state, the stored data is a high logic level. Phase change memory is also known as phase random access memory (PRAM), phase change random access memory (PCRAM), ovonic unified memory, chalcogenide random access memory (or C-RAM), etc.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
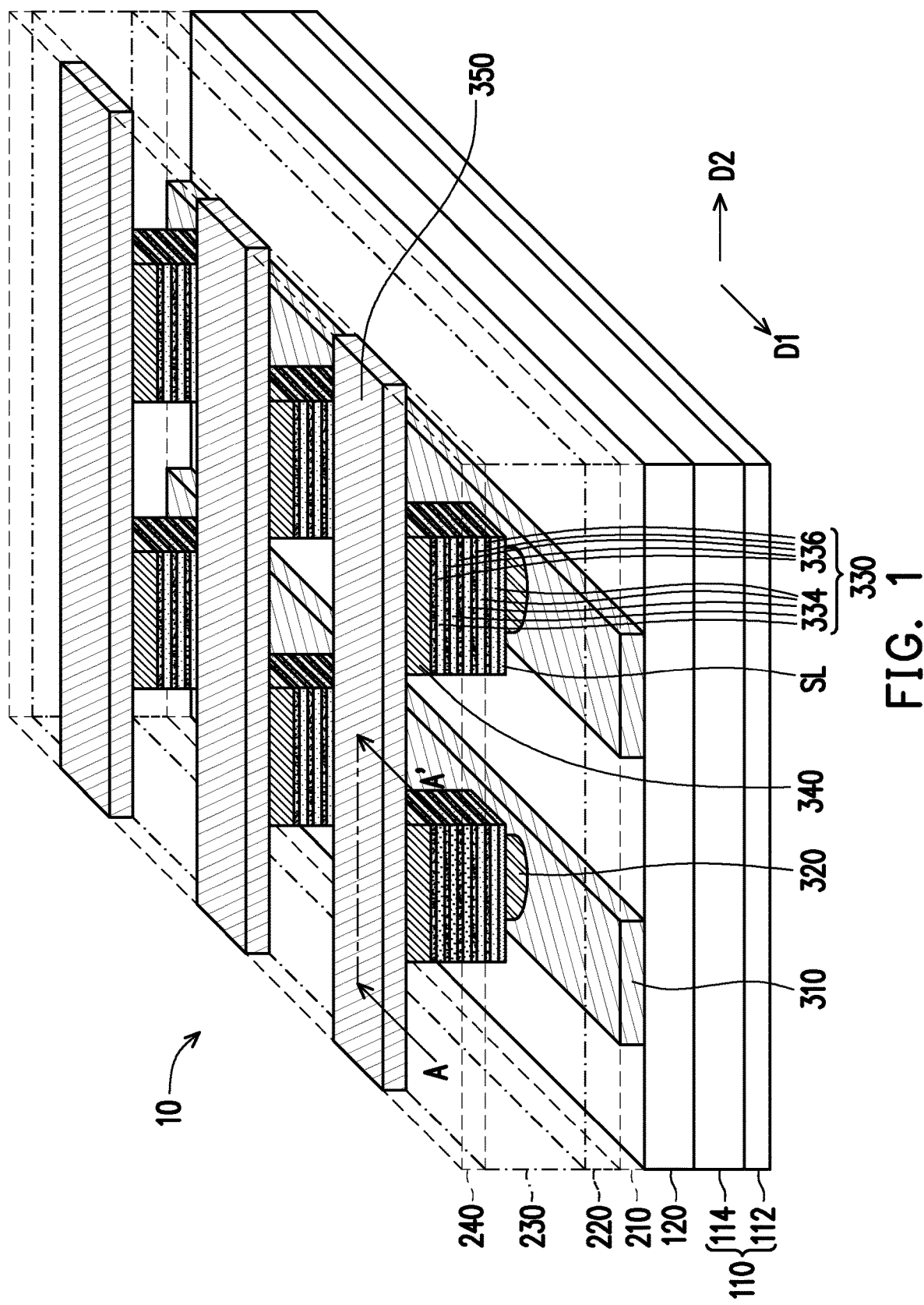
FIG. 1 is a perspective view of a memory device in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about", "approximately", or "substantially" shall generally mean within 20 percent, or within 10 percent, or within 5 percent of a given value or range. Numerical quantities given herein are approximate, meaning that the term "around", "about", "approximately", or "substantially" can be inferred if not expressly stated.

This disclosure relates to a memory device including a superlattice structure. Because of the superlattice structure, the reset current of the memory device can be reduced. Such structure and its fabrication method does not add area burden to the device and thus enhances an efficient use of substrate area for higher density devices.

FIG. 1 is a perspective view of a memory device 10 in accordance with various embodiments of the present disclosure. Referring to FIG. 1, the memory device 10 comprises a substrate 110, seed layers SL, superlattice structures 330 and top electrodes 340. In this embodiment, the memory device 10 further comprises one or more inter-metal dielectric (IMD) layer 120, a first dielectric layer 210, first signal lines 310, a second dielectric layer 220, bottom electrodes 320, a third dielectric layer 230, a fourth dielectric layer 240 and second signal lines 350.

In FIG. 1, one bottom electrode 320, one seed layer SL, one superlattice structure 330, and one top electrode 340 form a memory cell. In FIG. 1, the memory device 10 includes six memory cells arranged as an array. In some embodiments, the memory cell may be a superlattice phase change random access memory.

In FIG. 1, the memory cells are formed over the substrate 110. In some embodiments, the substrate 110 is a wafer including a semiconductor layer 112 and a circuit layer 114 formed over the semiconductor layer 112. The memory cells may be formed above a logic region or a memory region of the wafer. Furthermore, one or more inter-metal dielectric (IMD) layer 120 may be formed between the substrate 110 and the memory cells. The IMD 120 may be an interconnection between the circuit 114 and the memory cells. In some embodiments, the IMD layer 120 may be silicon oxide, low-k silicon oxide such as a porous silicon oxide layer, other suitable interlayer dielectric (ILD) material, other suitable inter-metal dielectric material, combinations thereof, or the like. In some embodiments, the IMD layer 120 is a low-k dielectric layer made from extra low-k materials, extreme low-k materials, combinations thereof, or the like. In some embodiments, the dielectric material in the IMD layer 120 may have a dielectric constant lower than 2.4. The IMD layer 120 also includes conductive elements for interconnecting the memory cells and the circuit 114.

The first signal lines 310 and the first dielectric layer 210 are located above the IMD 120. The first signal lines 310 are embedded in the first dielectric layer 210 and extending along the first direction D1. In some embodiments, the first signal lines 310 may include, for example, AlCu, Cu, Ru or other suitable materials. In some embodiments, the first dielectric layer 210 may include, for example, silicon oxide, low-k silicon oxide such as a porous silicon oxide layer, other suitable dielectric material, combinations thereof, or the like.

The bottom electrodes 320 are located above the first signal lines 310, and the second dielectric layer 220 are located above the first signal lines 310 and the first dielectric layer 210. The bottom electrodes 320 are embedded in the second dielectric layer 220 and electrically connected with the first signal lines 310. In FIG. 1, the bottom electrodes 320 arranged along the first direction D1 are in contact with one corresponding signal line 310, and the bottom electrodes 320 arranged along the second direction D2 are in contact with different signal lines 310. In some embodiments, the first direction D1 is substantially perpendicular to the second direction D2. In some embodiments, the bottom electrodes 320 may include, for example, Ti, TiN, W, Cu, Ru or other suitable materials. In some embodiments, the second dielectric layer 220 may include, for example, silicon oxide, low-k silicon oxide such as a porous silicon oxide layer, other suitable dielectric material, combinations thereof, or the like.

In some embodiments, a barrier layer (not shown in FIG. 1) may be formed between the bottom electrodes 320 and the second dielectric layer 220. The barrier layer can improve the adhesion between the first signal lines 310 and a material formed thereon (such as the bottom electrodes 320), or prevent the metal in the bottom electrodes 320 from diffusing into the second dielectric layer 220. The barrier layer may include metal nitride materials. For example, the barrier layer includes Ta, TaN, or other suitable materials. In some embodiments, the barrier layer includes a single layer or multiple layers. For a multiple-layer configuration, the layers include different compositions of metal nitride from each other.

The seed layers SL are disposed over the substrate 110. Each seed layer SL is disposed on and in contact with one corresponding bottom electrode 320. Each seed layer SL comprises carbon and silicon. In some embodiments, each seed layer SL contains 3 wt % to 5 wt % silicon and 95 wt % to 97 wt % carbon. For example, the seed layers SL contains 4 wt % to 5 wt % silicon and 95 wt % to 96 wt % carbon. In some embodiments, the thickness of each seed layer SL is 10 Å to 30 Å.

The superlattice structures 330 are located above the seed layers SL. Each superlattice structure 330 is directly disposed on one corresponding seed layer SL. Each superlattice structure 330 comprises a plurality of first metal layers 334 and a plurality of second metal layers 336 stacked alternately. In some embodiments, the first metal layers 334 are made of $Sb_2Te_3$, and the second metal layers 336 are made of an alloy including Ge and Te (such as GeTe, $GeTe_2$, or the combination thereof). In each superlattice structure 330, the bottom one of the first metal layers 334 is in contact with the one corresponding seed layer SL. The bottom layer of each superlattice structure 330 is made of $Sb_2Te_3$ so as to manufacture each superlattice structure 330 to orient the growth along the <111> direction. In some embodiments, the thickness of each first metal layer 334 is thicker than that of each second metal layer 336. For example, the thickness of each first metal layer 334 is 30 Å to and the thickness of each second metal layer 336 is 10 Å to 20 Å. However, the disclosure is not limited thereto.

In FIG. 1, the superlattice structures 330 include five first metal layers 334 and five second metal layers 336. However, the disclosure is not limited thereto. The number of the first metal layers 334 and the number of the second metal layers 336 can be adjusted according to the actual needs.

The top electrodes 340 are located over the superlattice structures 330. Each top electrode 340 is directly located on one corresponding superlattice structure 330. In some embodiments, in each superlattice structure 330, the top one of the second metal layers 336 is in contact with one corresponding top electrode 340. The top electrodes 340 may be metal, metal-nitride (e.g., TiN), doped polysilicon, other suitable conductive material, combinations thereof, or the like. For example, the top electrodes 340 may be tantalum nitride, titanium nitride, platinum, other suitable metal, combinations thereof, or the like. In some embodiments, the thickness of each top electrode 340 is 10 nm to 30 nm.

The third dielectric layer 230 is located above the second dielectric layer 220 and surrounding sidewalls of the superlattice structures 330, sidewalls of the seed layers SL and sidewalls of the top electrodes 340. The third dielectric layer 230 may include, for example, silicon oxide, low-k silicon oxide such as a porous silicon oxide layer, other suitable dielectric material, combinations thereof, or the like.

The second signal lines 350 and the fourth dielectric layer 240 are located above the top electrodes 340 and the third dielectric layer 230. The second signal lines 350 are embedded in the fourth dielectric layer 240 and extending along the second direction D2. The first signal lines 310 and the second signal lines 350 are extending on different planes. The top electrodes 340 are electrically connected with the second signal lines 350. In FIG. 1, the top electrodes 340 arranged along the first direction D1 are in contact with different second signal lines 350, and the top electrodes 340 arranged along the second direction D2 are in contact with one corresponding second signal lines 350. In some embodiments, the second signal lines 350 may include, for example, AlCu, Cu, Ru or other suitable materials. In some embodiments, the fourth dielectric layer 240 may include, for example, silicon oxide, low-k silicon oxide such as a porous silicon oxide layer, other suitable dielectric material, combinations thereof, or the like.

In this embodiment, in each superlattice structure 330, Ge atoms may migrate between the first metal layer 334 ($Sb_2Te_3$) and the second metal layers 336 (The alloy including Ge and Te), thereby the memory cell can be switched between the high resistance state (HRS) and the low resistance state (LRS). The vertical displacement of Ge atoms may be introduced by low electric field or small heat. When Ge atoms move from the second metal layers 336 (The alloy including Ge and Te) to the first metal layers 334 ($Sb_2Te_3$) at the interface of the first metal layers 334 and the second metal layers 336, the memory cell is in the LRS. When Ge atoms return from the first metal layers 334 to the second metal layers 336, the memory cell is in the HRS. In other word, the superlattice structures 330 can be switched between HRS and LRS without switching between crystalline state and amorphous state. The superlattice structures 330 are crystalline in both of HRS and LRS. Base on the superlattice structures 330, the memory device 10 has the advantages of low programming current (set current or reset current) and fast working time. In some embodiments, the programming current of superlattice structure 330 is 50µA when the contact area of between the bottom electrode 320 and the seed layer SL is 100 $nm^2$~400 $nm^2$.

FIGS. 2A to 2L schematically illustrates cross-sectional views of the fabrication method of the memory device 10 in FIG. 1. Various operations of the fabrication method are discussed in association with cross-section diagrams FIGS.

2A to 2L, where illustrate cross-sectional views along the line A-A illustrated in FIG. 1.

Figure 2A:
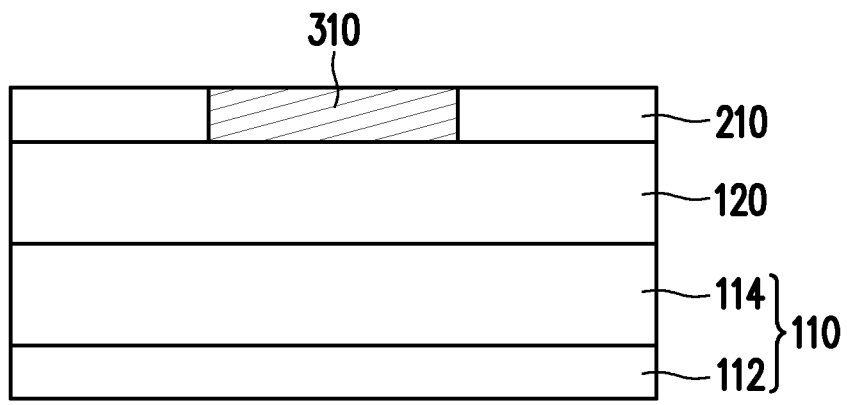
FIGS. 2A to 2L schematically illustrates cross-sectional views of the fabrication method of the memory device in FIG. 1.

Referring to FIG. 2A, a substrate 110 having a semiconductor layer 112 and a circuit 114 formed thereon is provided. The semiconductor layer 112 may be a silicon substrate. Alternatively, the semiconductor layer 112 may include another elementary semiconductor, such as germanium; a compound semiconductor including silicon carbide; an alloy semiconductor including silicon germanium; or combinations thereof. The semiconductor layer 112 may include doped regions, such as p-wells and n-wells. In some embodiments, the substrate 110 is a workpiece that includes the semiconductor layer 112 and various features formed in and over and attached to the semiconductor layer 112. In some embodiments, the substrate 110 further includes an insulator over the semiconductor layer 112. That is, the substrate 110 may include a semiconductor on insulator (SOI) substrate. In some embodiments, the circuit 114 includes transistors formed by transistor fabrication processes and may be a planar transistor, such as polysilicon gate transistors or high-k metal gate transistors, or a multi-gate transistor, such as fin field effect transistors. After the transistors are formed, one or more metal/dielectric layers of a multi-level interconnect (MLI) is formed over the transistors. According to some embodiments, plural metal/dielectric layers are formed over the transistors. In some embodiments, the circuit 114 may be a logic circuit or a memory circuit.

At least one IMD layer 120 is formed over the substrate 110, as shown in FIG. 2A. The IMD layer 120 may provide electrical interconnection between the memory cells and the circuit 114 as well as structural support for the various features of the memory device during many fabrication process operations, some of which will be discussed herein.

The first signal lines 310 embedded in the first dielectric layer 210 are formed above the substrate 110. In this embodiment, the first signal lines 310 and the first dielectric layer 210 are formed on the IMD layer 120. In some embodiments, the first signal lines 310 may be formed by a damascene process. Specifically, a plurality of openings are formed in the first dielectric layer 210. Then, a filling material is formed in the openings of the first dielectric layer 210. The filling material is electrically connected to the IMD layer 120. Then, excessive portion of the filling material is removed by performing a CMP process to form the first signal lines 310 embedded in the first dielectric layer 210.

Figure 2B:
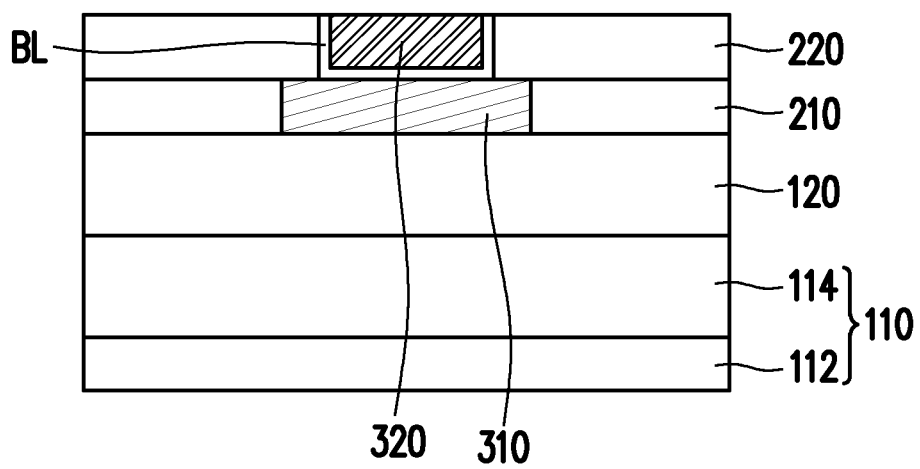

Referring to FIG. 2B, the bottom electrodes 320 embedded in the second dielectric layer 220 are formed above the first signal lines 310. The second dielectric layer 220 is located over the first dielectric layer 210. In some embodiments, the bottom electrodes 320 may also be formed by a damascene process. Specifically, a plurality of openings are formed in the second dielectric layer 220. After the formation, the openings of the second dielectric layer 220 respectively expose the first signal lines 310. Then, a barrier layer BL is formed in the openings of the second dielectric layer 220. In some embodiments, the barrier layer BL also extends outside the openings. After forming the barrier layer BL, a filling material is formed in the openings of the second dielectric layer 220. The filling material is electrically connected to the first signal lines 310. Then, excessive portion of the filling material and the barrier layer BL are removed by performing a CMP process to form the bottom electrodes 320 and the barrier layer BL in the second dielectric layer 220.

Figure 2C:
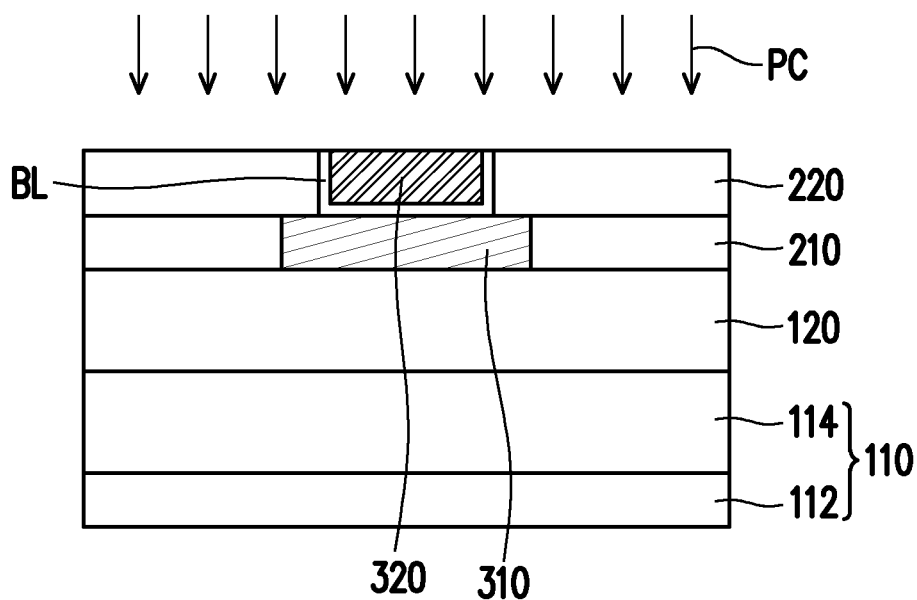

Referring to FIG. 2C, a pre-clean process PC is performed on the exposed surface of the bottom electrodes 320, the barrier layer BL and the second dielectric layer 220. In some embodiments, the pre-clean process PC may be performed by HBr plasma or $H_2$ plasma. The HBr plasma or $H_2$ plasma will react with the metal oxide (e.g., TiOx, WOx, CuOx or RuOx) formed on the bottom electrodes 320, such that the metal oxide is removed to expose the conductive material of the bottom electrodes 320.

Figure 2D:
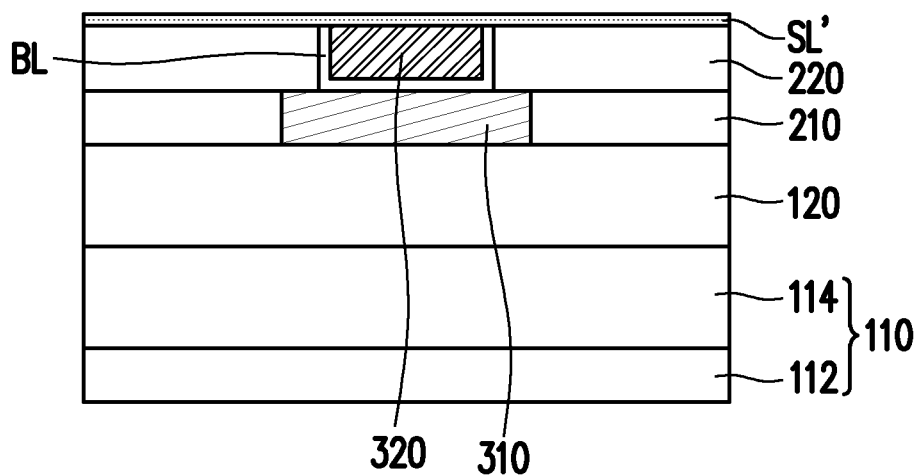

Referring to FIG. 2D, a seed material layer SL' is formed over the substrate 110. In this embodiment, the seed material layer SL' is formed on and in contact with the bottom electrodes 320, the barrier layer BL and the second dielectric layer 220. The seed material layer SL' includes carbon and silicon. In some embodiments, the seed material layer SL' contains 3 wt % to 5 wt % silicon and 95 wt % to 97 wt % carbon. For example, the seed material layer SL' contains 4 wt % to 5 wt % silicon and 95 wt % to 96 wt % carbon. In some embodiments, the seed material layer SL' is formed by atomic layer deposition (ALD), but the disclosure is not limited thereto.

Figure 2E:
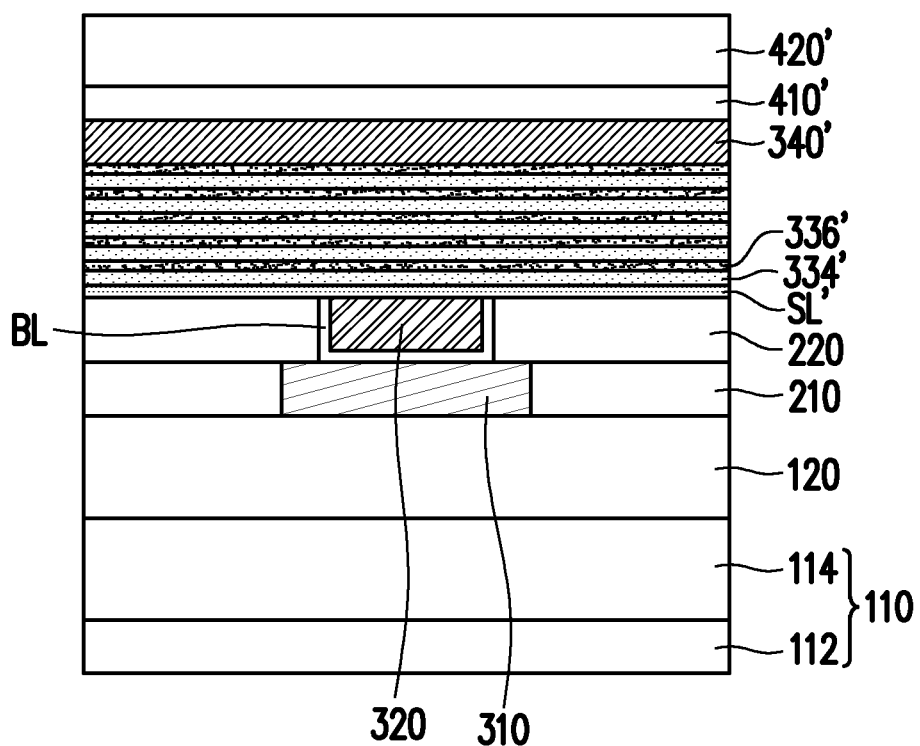

Referring to FIG. 2E, forming first metal material layers 334' and second metal material layers 336' above the seed material layer SL', wherein the first metal material layers 334' and the second metal material layers 336' are stacked alternately. In some embodiments, the first metal material layers 334' are made of $Sb_2Te_3$, and the second metal material layers 336' are made of are made of an alloy including Ge and Te (such as GeTe, $GeTe_2$, or the combination thereof). The bottom one of the first metal material layers 334' is directly disposed on the seed material layer SL'. With the seed material layer SL', the adhesion between the bottom one of the first metal material layers 334' and the bottom electrodes 320 can be improved. Therefore, the subsequently formed superlattice structure can be made more complete. In some embodiments, the first metal material layers 334' and the second metal material layers 336' are also formed by ALD, but the disclosure is not limited thereto.

A top electrode material layer 340' is formed over the stack of the first metal material layers 334' and the second metal material layers 336'. In some embodiments, the top electrode material layer 340' is made of tungsten and in contact with the second metal material layer 336' which is made of the alloy including Ge and Te. However, the disclosure is not limited thereto. In other embodiments, the top electrode material layer 340' is made of other materials and in contact with the first metal material layer 334' which is made of $Sb_2Te_3$.

Hard masks 400 are formed over the top electrode material layer 340', as shown in FIGS. 2E to 2H. Specifically, a first hard mask material layer 410' is formed over the top electrode material layer 340'. In some embodiments, the first hard mask material layer 410' includes nitrides, such as a silicon nitride or other suitable materials. Then, a second hard mask material layer 420' is formed over the first hard mask material layer 410'. In some embodiments, the second hard mask material layer 420' includes oxides, such as a silicon oxide or other suitable materials.

Figure 2F:
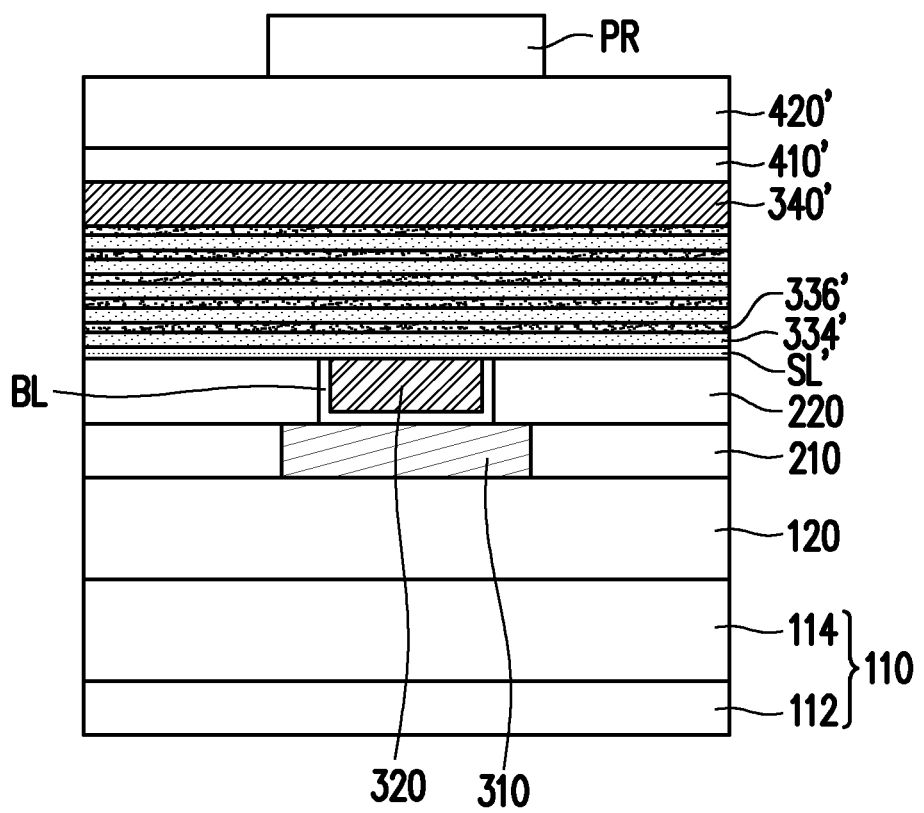
Figure 2G:
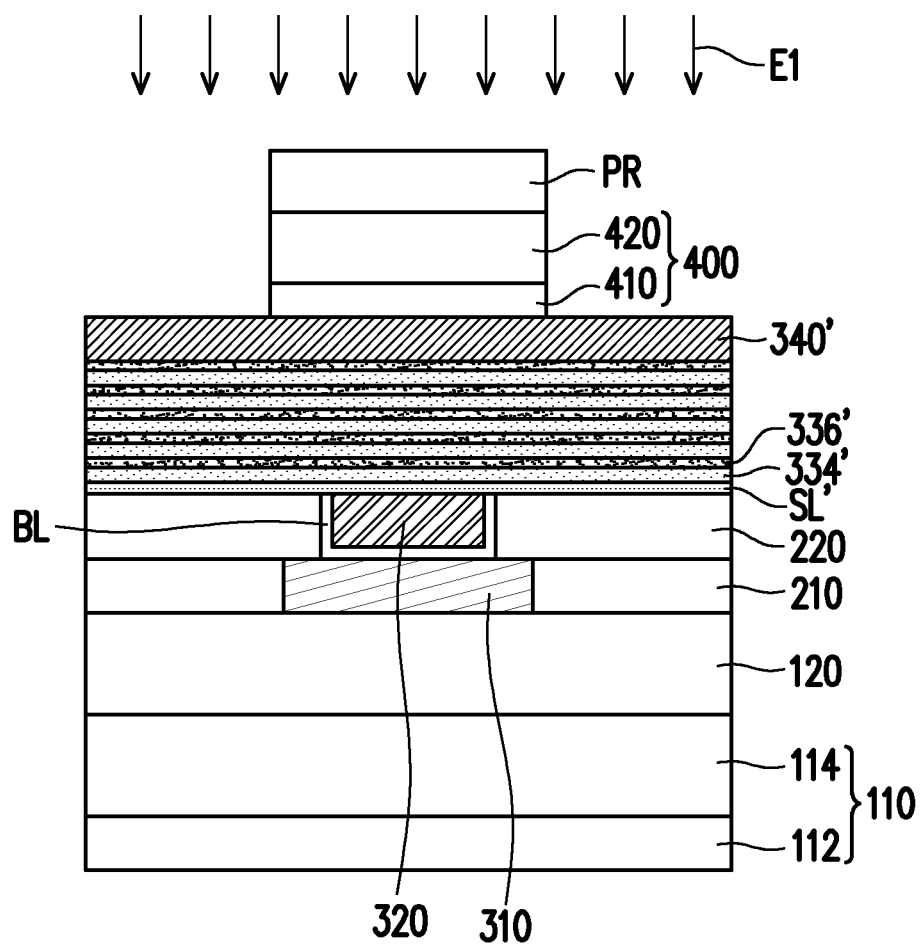

A patterned photoresist layer PR is formed over the second hard mask material layer 420', as shown in FIG. 2F. Using the patterned photoresist layer PR as a mask, an etching process E1 is performed to pattern the first hard mask material layer 410' and the second hard mask material layer 420' so as to form hard masks 400. Each hard mask 400 includes a first hard mask layer 410 and a second hard mask layer 420 stacked with each other. The etching process E1 is stop at the top electrode material layer 340', as shown in FIG. 2G.

In some embodiments, the etching process E1 is performed by dry etching, such as halogen plasma. The halogen plasma may be F plasma, $Cl_2$ plasma or HBr plasma.

Figure 2H:
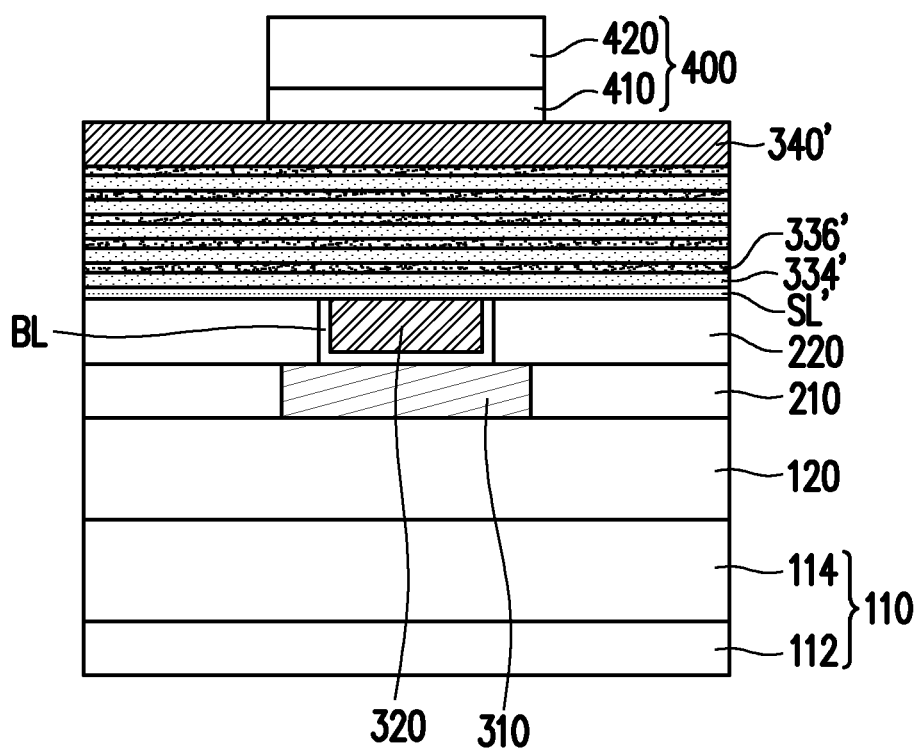

Referring to FIG. 2H, after the etching process E1, the residual patterned photoresist layer PR is removed by an acceptable ashing or stripping process, such as using an oxygen plasma or the like.

Figure 2I:
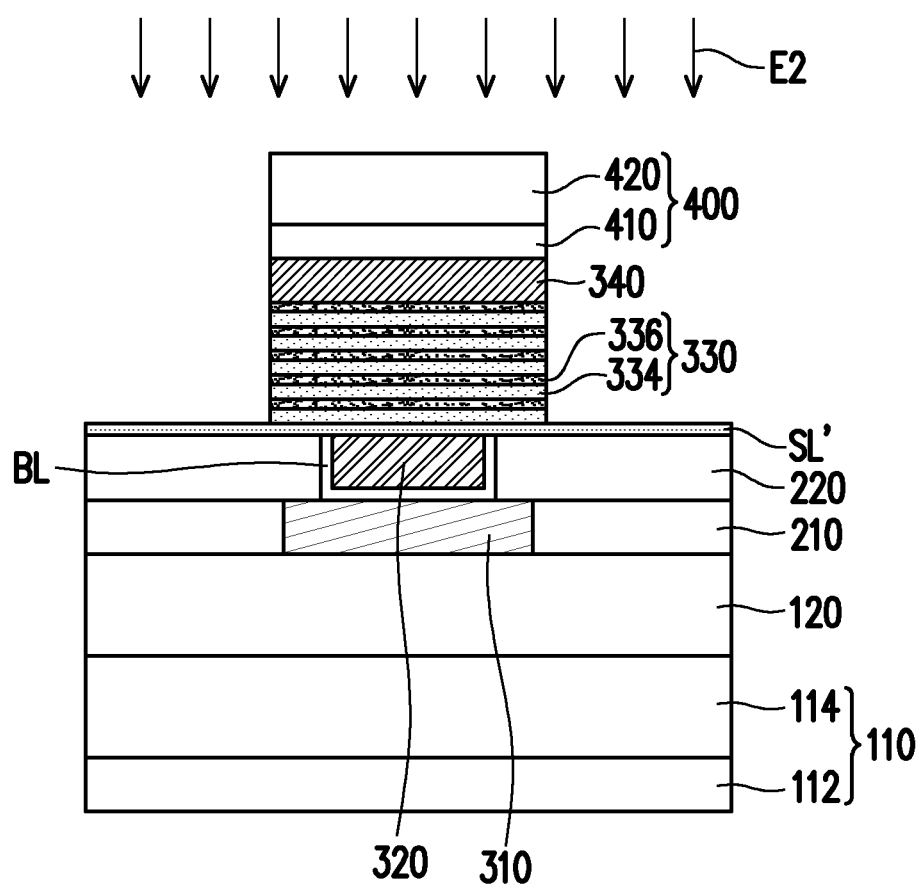

Referring to FIG. 2I, using the hard masks 400 as a mask, an etching process E2 is performed to pattern the top electrode material layer 340', the first metal material layers 334' and the second metal material layers 336' so as to form the top electrodes 340 and the superlattice structures 330. Each superlattice structure 330 includes the first metal layers 334 and the second metal layers 336 stacked alternately. The etching process E2 is performed after removing the residual patterned photoresist layer. Therefore, no photoresist ash or water steam exists during the etching process E2. In this way, the superlattice structures 330 are prevented from being contaminated by photoresist ash or water steam. The etching process E2 is stop at the seed material layer SL'. In some embodiments, an over etching may occur in the seed material layer SL' during the etching process E2 to ensure all of the first metal material layers 334' and the second metal material layers 336' are patterned.

In some embodiments, the etching process E2 is performed by $CF_4$ plasma or CHF 3 plasma. The F radical in the etching process E2 has good etching effect on Ge/Te. During the etching process E2, the F radical helps to inhibit the migration of the Te atoms, therefore, the Sb atoms can be stably maintained at original position. In some embodiments, the etching process E2 is performed with high source power (e.g., 600 Watt to 1500 Watt) and heavy ion bombardment power. The ion bombardment power may be enhanced by using high bias voltage (e.g., 200 V to 400 V). Since the etching process E2 is performed with high source power and heavy ion bombardment power, the etching process E2 has a short processing time, and less plasma damage is occurred. The etching process E2 can obtain the superlattice structure 330 with high aspect ratio without reducing the vacancy concentration between the first metal layers 334 and the second metal layers 336. Therefore, the Ge atoms may active among vacancies between $Sb_2Te_3$ layers and GeTe layers (or GeTe 2 layers), and the programing current of the superlattice structures 330 can be reduced.

Figure 2J:
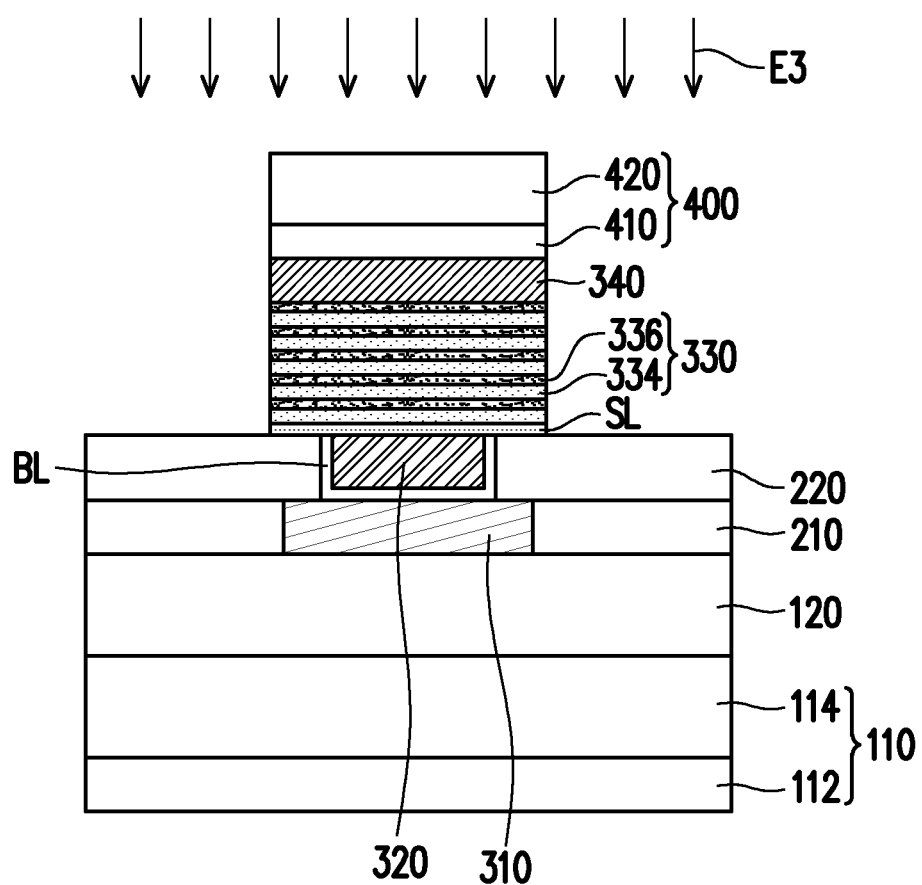

Referring to FIG. 2J, using the hard masks 400 as a mask, an etching process E3 is performed to pattern the seed material layer SL' so as to form seed layers SL. In this embodiment, both of the etching process E2 (shown in FIG. 2I) and the etching process E3 are performed with hard masks 400. Therefore, the top electrodes 340, the superlattice structures 330 and the seed layers SL have the same vertical projection pattern on the substrate 110. The sidewalls of the top electrodes 340, the sidewalls of the first metal layers 334, the sidewalls of the second metal layers 336 and the sidewalls of the seed layer SL may be aligned with each other. The etching process E3 is stop at the second dielectric layer 220.

The etching process E3 may be an ion milling process. In some embodiments, the etching process E3 is performed by CH 4 plasma, Ar plasma or $N_2$ plasma. The influence of the ion milling process on the composition of the superlattice structure 330 is small. In other word, the seed material layer SL' can be patterned by the ion milling process without changing the composition of the superlattice structure 330.

Figure 2K:
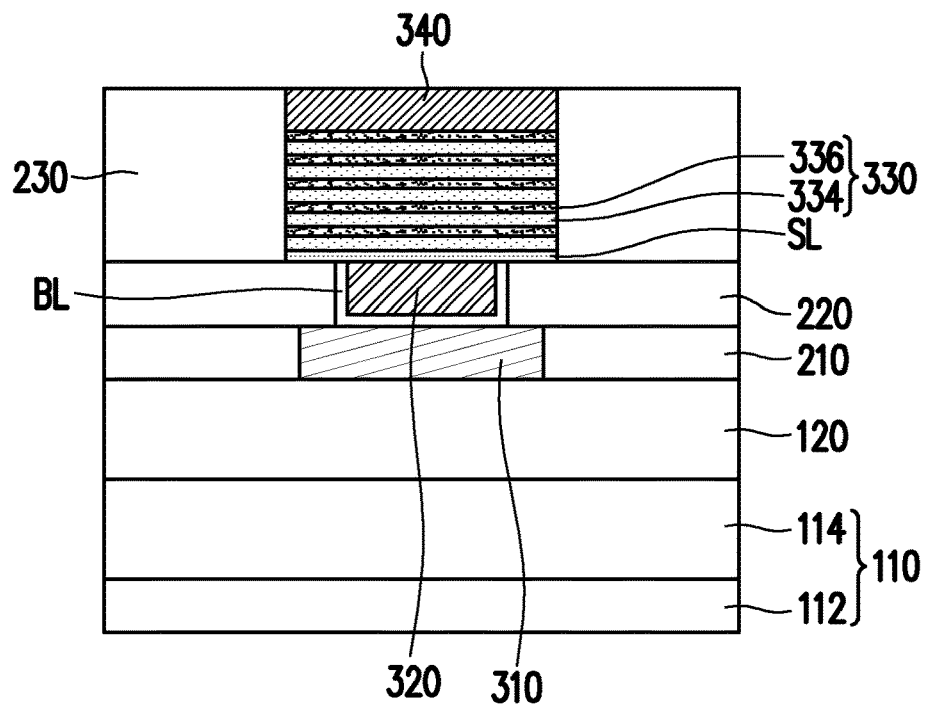

Referring to FIG. 2K, a third dielectric layer 230 is formed on the second dielectric layer 220. Specifically, a dielectric layer is deposited over the structure of FIG. 2J (i.e., over the top electrodes 340 and the second dielectric layer 220). The dielectric layer is over the top electrodes 340 and surrounding the sidewalls of the top electrodes 340, the sidewalls of the superlattice structures 330 and the sidewalls of the seed layers SL. Then, a CMP process is performed on the dielectric layer to form the third dielectric layer 230 exposing the top electrodes 340.

Figure 2L:
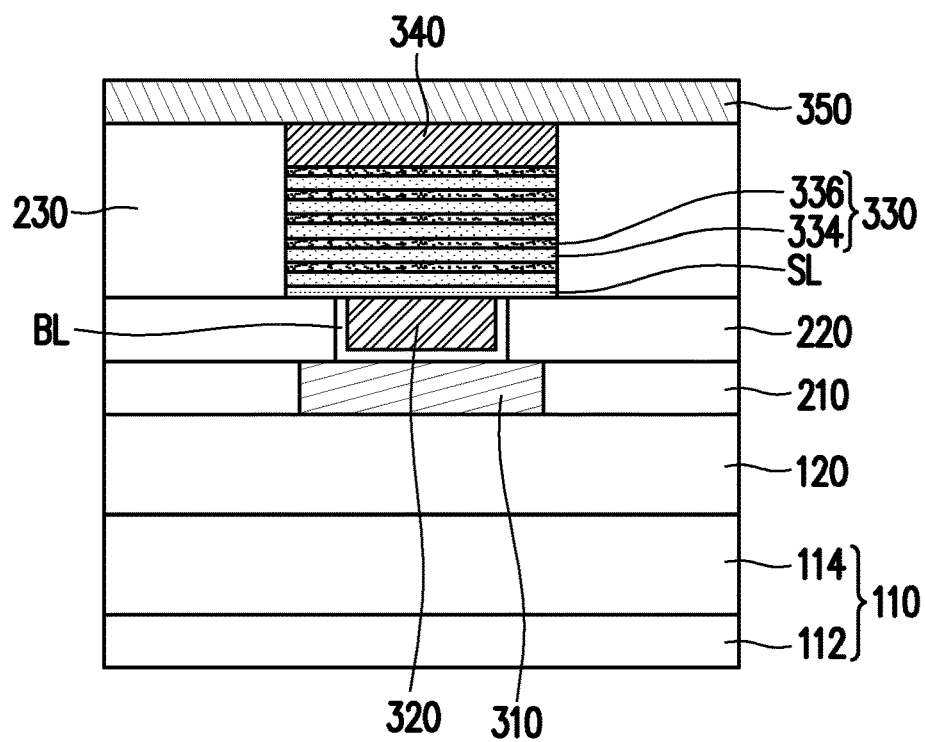

Referring to FIG. 2L, the second signal lines 350 embedded in the fourth dielectric layer 240 (shown in FIG. 1) are formed above the substrate 110. In this embodiment, the second signal lines 350 and the fourth dielectric layer 240 are formed on the third dielectric layer 230. In some embodiments, the second signal lines 350 may be formed by a damascene process. Specifically, a plurality of openings are formed in the fourth dielectric layer 240. Then, filling material is formed in the openings of the fourth dielectric layer 240. The filling material is electrically connected to the top electrodes 340. Then, excessive portion of the filling material is removed by performing a CMP process to form the second signal lines 350 embedded in the fourth dielectric layer 240.

Figure 3:
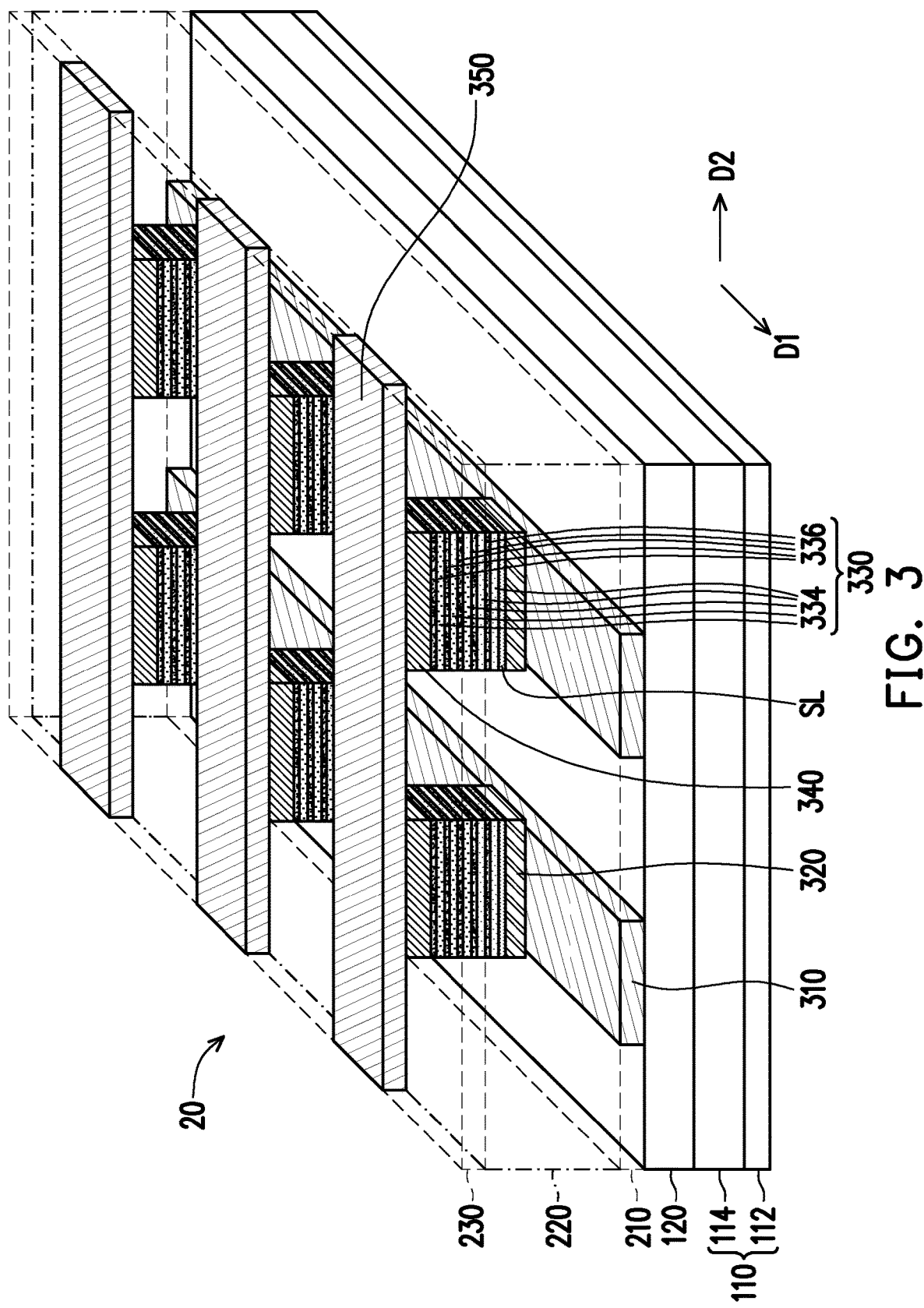
FIG. 3 is a perspective view of a memory device in accordance with various embodiments of the present disclosure.

FIG. 3 is a perspective view of a memory device 20 in accordance with various embodiments of the present disclosure. It should be noted herein that, in embodiments provided in FIG. 3, element numerals and partial content of the embodiments provided in FIG. 1 are followed, the same or similar reference numerals being used to represent the same or similar elements, and description of the same technical content being omitted. For a description of an omitted part, reference may be made to the foregoing embodiment, and the descriptions thereof are omitted herein.

The different between the memory device 20 in FIG. 3 and the memory device 10 in FIG. 1 is that: the bottom electrodes 320 are aligned with the seed layers SL in the memory device 20.

FIGS. 4A to 4I schematically illustrates cross-sectional views of the fabrication method of the memory device 20 in FIG. 3. Various operations of the fabrication method are discussed in association with cross-section diagrams FIGS. 4A to 4I, where illustrate cross-sectional views along the line A-A illustrated in FIG. 3.

Figure 4A:
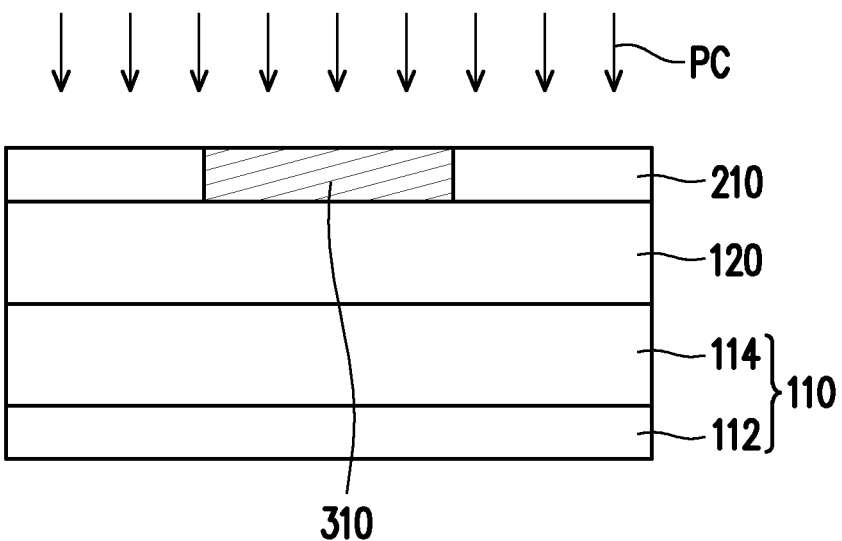
FIGS. 4A to 4I schematically illustrates cross-sectional views of the fabrication method of the memory device in FIG. 3.

Referring to FIG. 4A, the pre-clean process PC is performed on the exposed surface of the first signal lines 310 and the first dielectric layer 210.

Figure 4B:
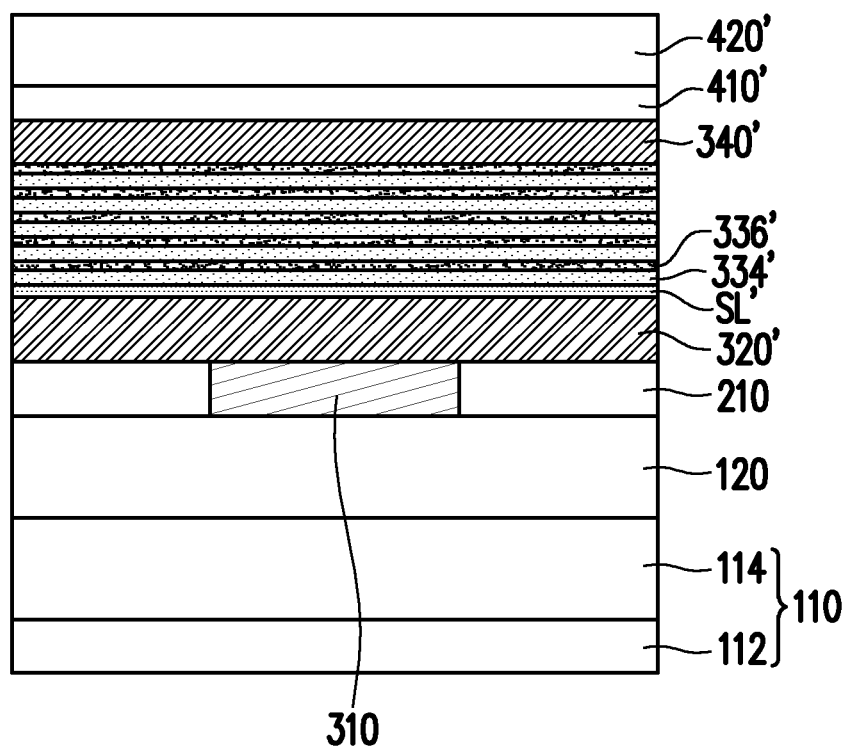

Referring to FIG. 4B, a bottom electrode material layer 320' is formed over the first signal lines 310 and the first dielectric layer 210. The bottom electrode material layer 320' is blanketed on the first signal lines 310 and the first dielectric layer 210. The seed material layer SL' is formed over the bottom electrode material layer 320'. The first metal material layers 334' and the second metal material layers 336' are formed above the seed material layer SL', wherein the first metal material layers 334' and the second metal material layers 336' are stacked alternately.

The hard masks 400 are formed over the top electrode material layer 340', as shown in FIGS. 4B to 4E. Specifically, a first hard mask material layer 410' is formed over the top electrode material layer 340'. Then, a second hard mask material layer 420' is formed over the first hard mask material layer 410'.

Figure 4C:
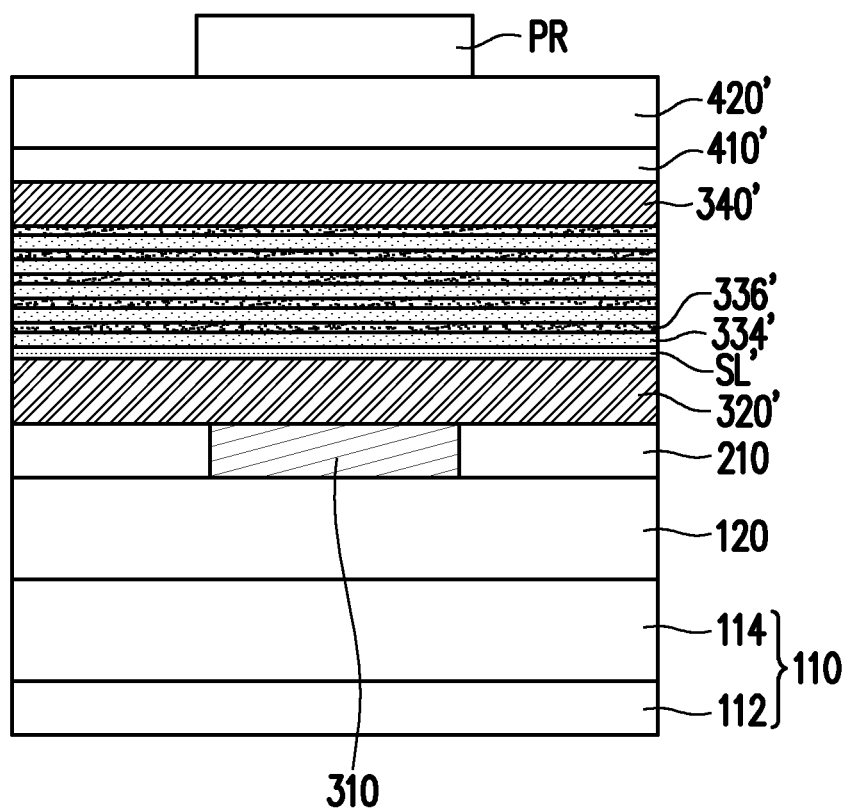
Figure 4D:
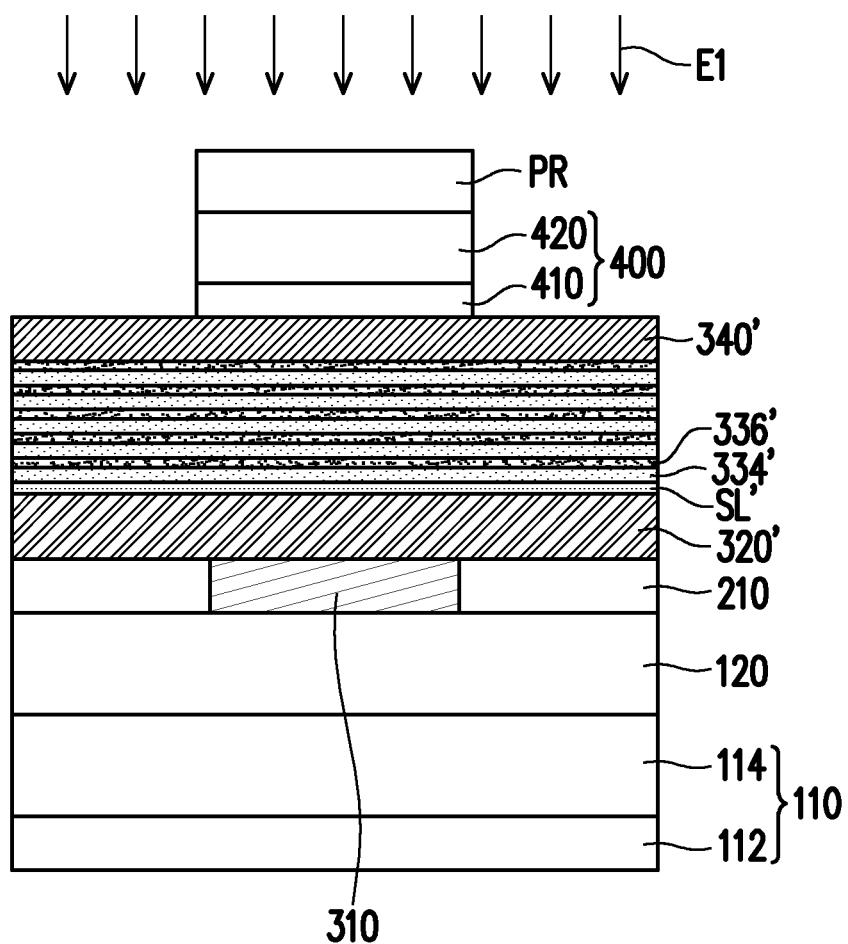

A patterned photoresist layer PR is formed over the second hard mask material layer 420', as shown in FIG. 4C. Using the patterned photoresist layer PR as a mask, an etching process E1 is performed to pattern the first hard mask material layer 410' and the second hard mask material layer 420' so as to form hard masks 400. Each hard mask 400 includes a first hard mask layer 410 and a second hard mask layer 420 stacked with each other. The etching process E1 is stop at the top electrode material layer 340', as shown in FIG. 4D.

In some embodiments, the etching process E1 is performed by dry etching, such as halogen plasma. The halogen plasma may be F plasma, $Cl_2$ plasma or HBr plasma.

Figure 4E:
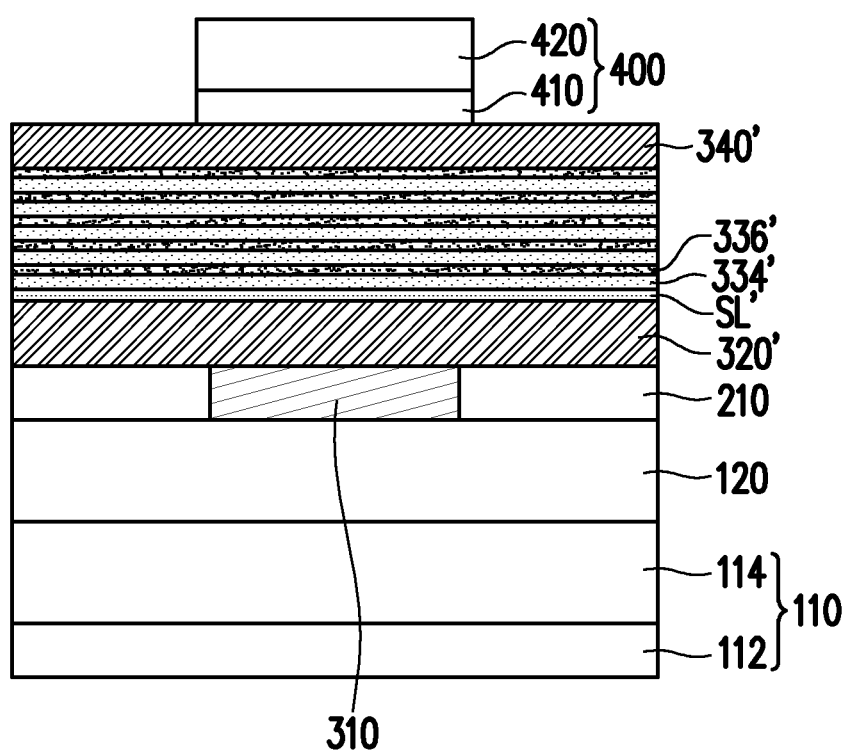

Referring to FIG. 4E, after the etching process E1, the residual patterned photoresist layer PR is removed by an acceptable ashing or stripping process, such as using an oxygen plasma or the like.

Figure 4F:
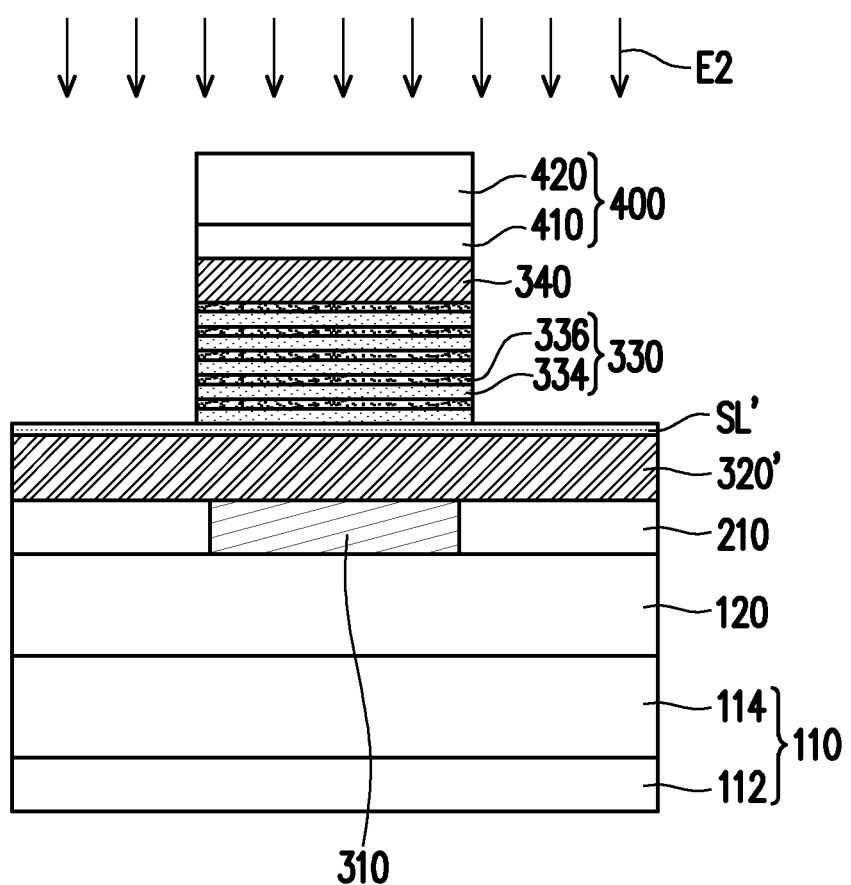

Referring to FIG. 4F, using the hard masks 400 as a mask, an etching process E2 is performed to pattern the top electrode material layer 340', the first metal material layers 334' and the second metal material layers 336' so as to form the top electrodes 340 and the superlattice structures 330. Each superlattice structure 330 includes the first metal layers 334 and the second metal layers 336 stacked alternately. The etching process E2 is performed after removing the residual patterned photoresist layer. Therefore, no photoresist ash or water steam exists during the etching process E2. In this way, the superlattice structures 330 are prevented from being contaminated by photoresist ash or water steam. The etching process E2 is stop at the seed material layer SL'. In some embodiments, an over etching may occur in the seed material layer SL' during the etching process E2 to ensure all of the first metal material layers 334' and the second metal material layers 336' are patterned.

In some embodiments, the etching process E2 is performed with high source power and heavy ion bombardment power. Since the etching process E2 is performed with high source power and heavy ion bombardment power, the etching process E2 has a short processing time, and less plasma damage is occurred.

Figure 4G:
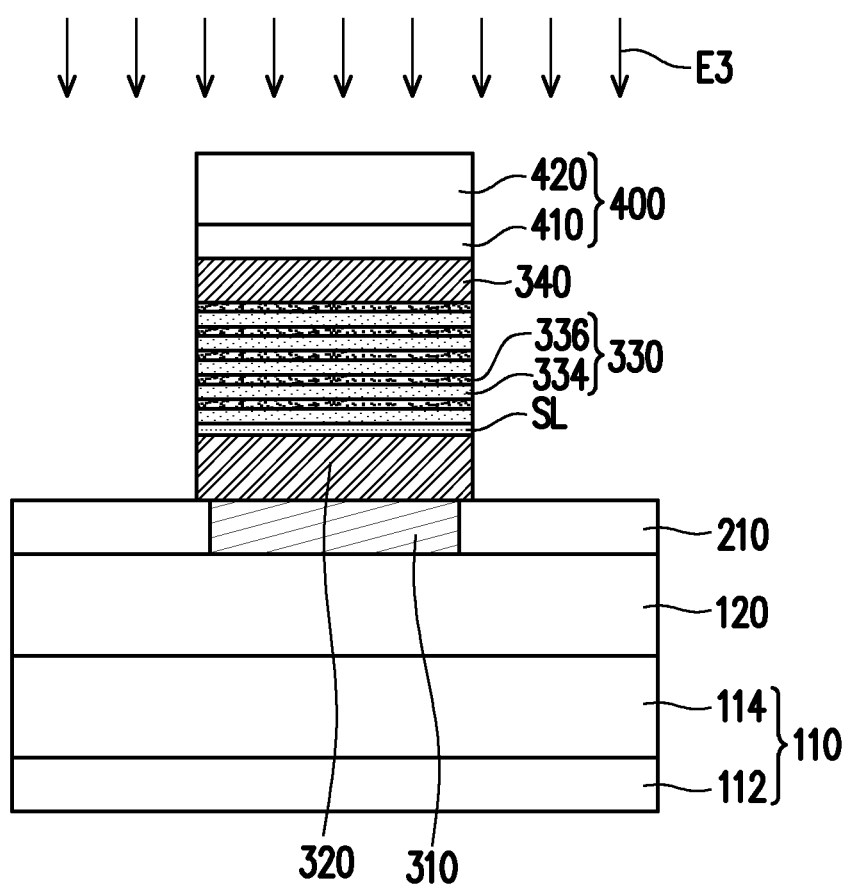

Referring to FIG. 4G, using the hard masks 400 as a mask, an etching process E3 is performed to pattern the seed material layer SL' and the bottom electrode material layer 320' so as to the seed layers SL and the bottom electrodes 320. In this embodiment, both of the etching process E2 (shown in FIG. 4F) and the etching process E3 are performed with hard masks 400. Therefore, the top electrodes 340, the superlattice structures 330, the seed layers SL and the bottom electrodes 320 have the same vertical projection pattern on the substrate 110. The sidewalls of the top electrodes 340, the sidewalls of the first metal layers 334, the sidewalls of the second metal layers 336, the sidewalls of the seed layers SL and the sidewalls of the bottom electrodes 320 may be aligned with each other. The etching process E3 is stop at the first dielectric layer 210.

The etching process E3 may be an ion milling process. In some embodiments, the etching process E3 is performed by CH 4 plasma, Ar plasma or $N_2$ plasma. The influence of the ion milling process on the composition of the superlattice structure 330 is small. In other word, the seed material layer SL' and the bottom electrode material layer 320' can be patterned by the ion milling process without changing the composition of the superlattice structure 330.

Figure 4H:
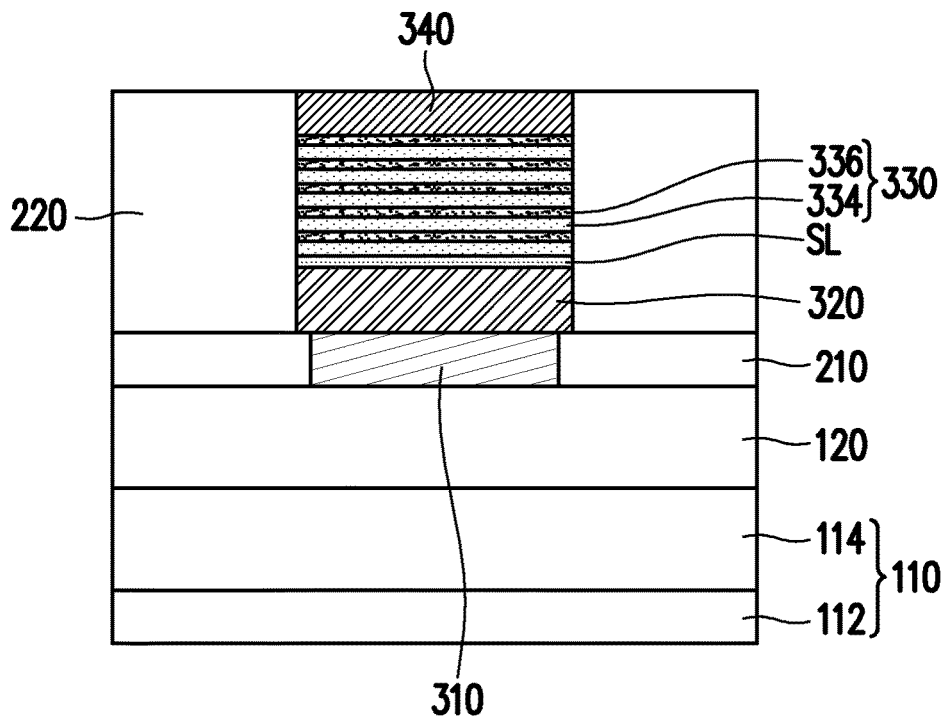

Referring to FIG. 4H, a second dielectric layer 220 is formed on the first dielectric layer 210. Specifically, a dielectric layer is deposited over the structure of FIG. 4G (i.e., over the top electrodes 340 and the second dielectric layer 220). The dielectric layer is over the top electrodes 340 and surrounding the sidewalls of the top electrodes 340, the sidewalls of the superlattice structures 330, the sidewalls of the seed layers SL and the sidewalls of the bottom electrodes 320. Then, a CMP process is performed on the dielectric layer to form the second dielectric layer 220 exposing the top electrodes 340.

Figure 4I:
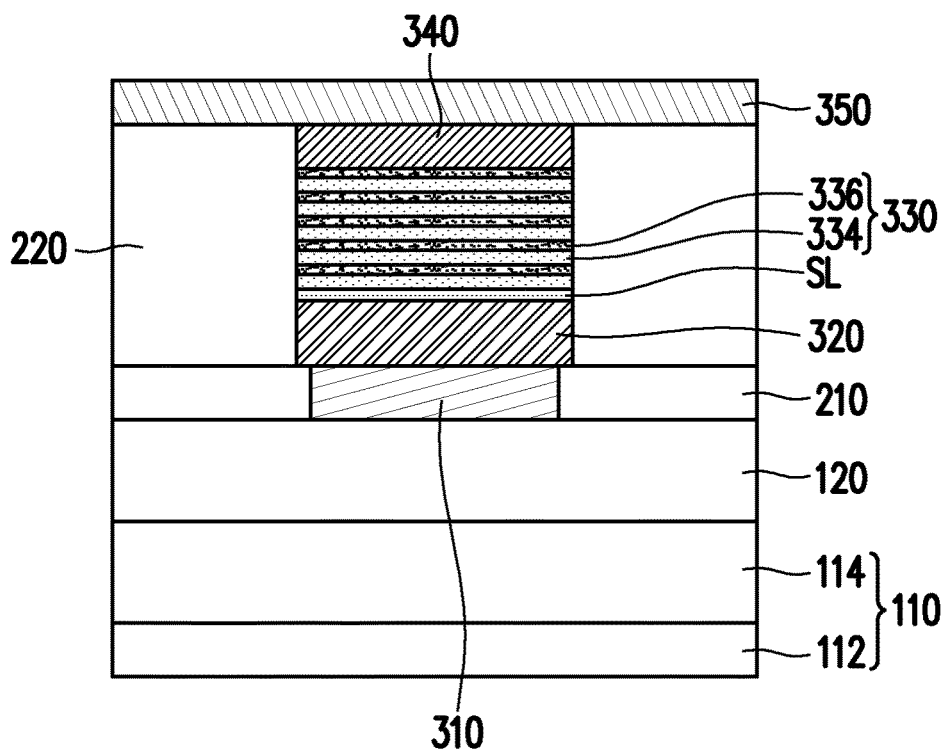

Referring to FIG. 4I, the second signal lines 350 embedded in the third dielectric layer 230 (as shown in FIG. 3) are formed above the substrate 110. In this embodiment, the second signal lines 350 and the third dielectric layer 230 are formed on the second dielectric layer 220. In some embodiments, the second signal lines 350 may be formed by a damascene process. Specifically, a plurality of openings are formed in the third dielectric layer 230. Then, filling material is formed in the openings of the third dielectric layer 230. The filling material is electrically connected to the top electrodes 340. Then, excessive portion of the filling material is removed by performing a CMP process to form the second signal lines 350 embedded in the third dielectric layer 230.

Figure 5:
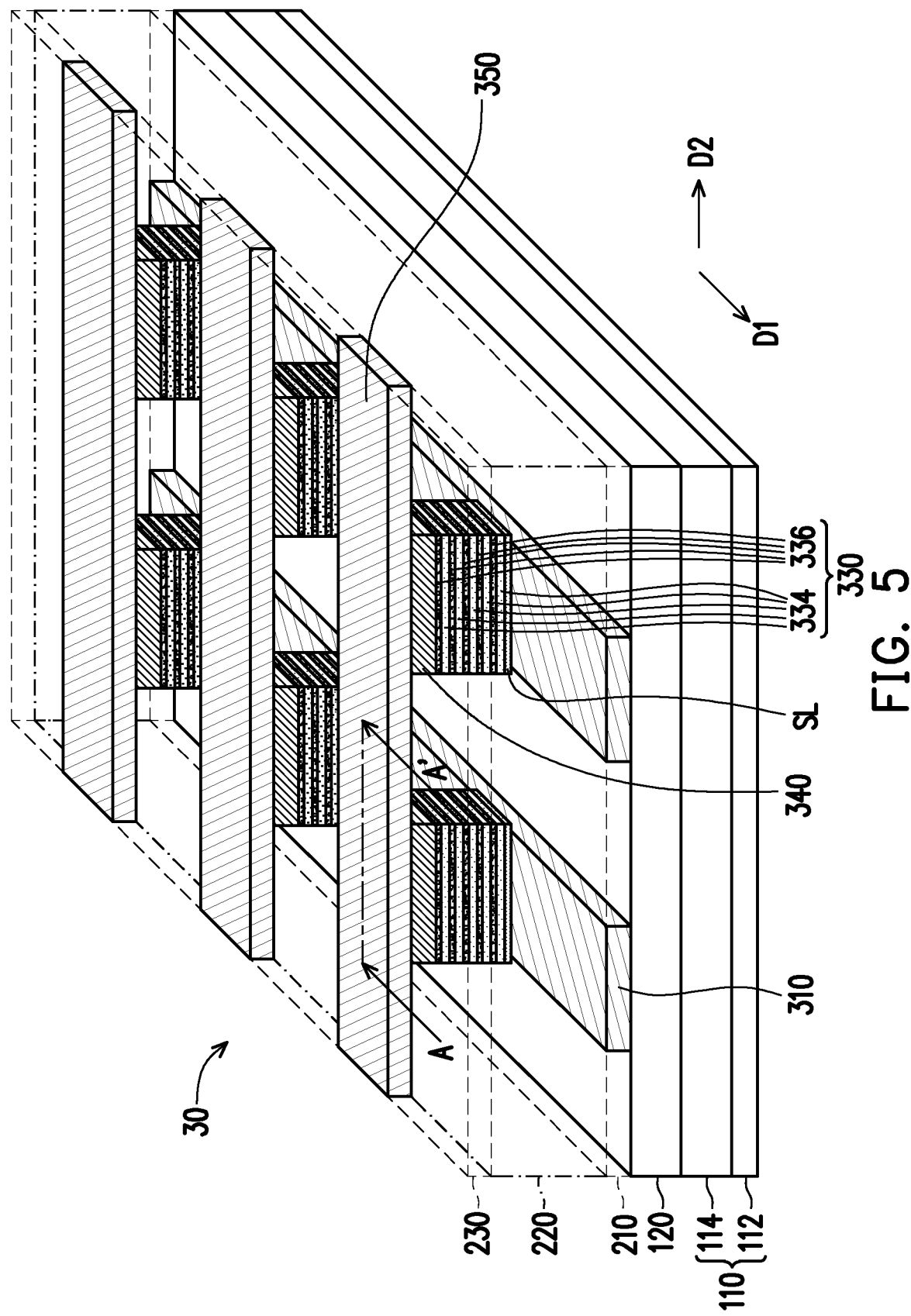
FIG. 5 is a perspective view of a memory device in accordance with various embodiments of the present disclosure.
Figure 6:
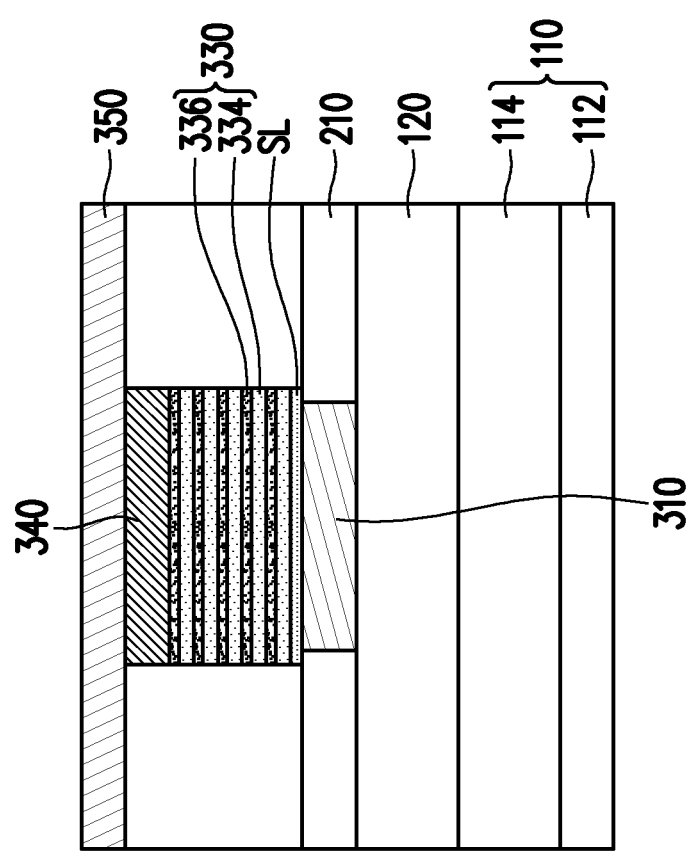
FIG. 6 schematically illustrates a cross-sectional view of the memory device in FIG. 5.

FIG. 5 is a perspective view of a memory device 30 in accordance with various embodiments of the present disclosure. FIG. 6 schematically illustrates a cross-sectional view of the memory device 30 in FIG. 5. It should be noted herein that, in embodiments provided in FIGS. 5 and 6, element numerals and partial content of the embodiments provided in FIG. 3 are followed, the same or similar reference numerals being used to represent the same or similar elements, and description of the same technical content being omitted. For a description of an omitted part, reference may be made to the foregoing embodiment, and the descriptions thereof are omitted herein.

The different between the memory device 30 in FIG. 3 and the memory device 20 in FIG. 3 is that: the seed layers SL of the memory device 30 are in contact with the first signal lines 310.

Referring to FIGS. 5 and 6, the seed layers SL are in contact with the first signal line 310, and the top electrodes 340 are electrically connected with the second signal line 350.

Generally, in a phase change memory, the current may pass through the bottom electrode to generate heat, thereby the phase change memory may switch between the crystalline state and the amorphous state by the heat. However, in this embodiment, the superlattice structures 330 needs only a small amount of heat (or electric field) to switch between the high resistance state (HRS) and the low resistance state (LRS). Therefore, there is no need to generate heat by the small size bottom electrode. The bottom electrode can be omitted.

In this embodiment, the seed material layer is formed over the first signal lines 310 and the first dielectric layer 210, and the seed material layer is in contact with the first signal lines 310. After forming the seed material layer, the first metal material layers and the second metal material layers are formed above the seed material layer. Then, the top electrode material layer is formed over a stack of the first metal material layers and the second metal material layers. After that, the top electrode material layer, the first metal material layers, the second metal material layers and the seed material layer are patterned by using the hard mask as a mask so as to form the top electrodes 340, the superlattice structures 330 and the seed layers SL.

According to some embodiments, a memory device comprises a substrate, a seed layer over the substrate, a superlattice structure in contact with the seed layer and a top electrode over the superlattice structure. The seed layer comprises carbon and silicon. The superlattice structure comprises first metal layers and second metal layers stacked alternately.

According to some embodiments, a memory device comprises a substrate, seed layers over the substrate, superlattice structures and top electrodes. Each seed layer comprises carbon and silicon. Each superlattice structure is directly disposed on one corresponding seed layer, wherein each superlattice structure comprises first metal layers and second metal layers stacked alternately. Each top electrode is located over one corresponding superlattice structure.

According to some embodiments, a fabrication method of a memory device, comprising: forming a seed material layer over a substrate, wherein the seed material layer comprises carbon and silicon; forming first metal material layers and second metal material layers above the seed material layer, wherein the first metal material layers and the second metal material layers are stacked alternately; forming a top electrode material layer over a stack of the first metal material layers and the second metal material layers; forming hard masks over the top electrode material layer; using the hard masks as a mask to perform a first etching process to pattern the top electrode material layer, the first metal material layers and the second metal material layers so as to form top electrodes and superlattice structures, wherein each superlattice structure comprises first metal layers and second metal layers stacked alternately; and using the hard masks as a mask to perform a second etching process to pattern the seed material layer so as to form seed layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a substrate;
   a seed layer over the substrate, wherein the seed layer comprises 95 wt % to 97 wt % carbon and 3 wt % to 5 wt % silicon;
   a superlattice structure in contact with the seed layer, wherein the superlattice structure comprises a plurality of first metal layers and a plurality of second metal layers stacked alternately, wherein the plurality of first metal layers comprise $Sb_2Te_3$, and the plurality of second metal layers comprise an alloy comprising Ge and Te, and a bottom one of the plurality of first metal layers is in contact with the seed layer; and
   a top electrode over the superlattice structure.

2. The memory device according to claim 1, further comprising:
   a first signal line extending along a first direction; and
   a bottom electrode, wherein the seed layer is disposed on and in contact with the bottom electrode, wherein the first signal line, the bottom electrode, the seed layer, and the superlattice structure are stacked along a second direction perpendicular to the first direction, wherein a barrier layer is disposed between and in contact with the first signal line and the bottom electrode or the bottom electrode is in contact with the first signal line.

3. The memory device according to claim 1, further comprising:
   a first signal line extending along a first direction, wherein the first signal line is in contact with the seed layer, wherein the first signal line, the seed layer, and the superlattice structure are stacked along a second direction perpendicular to the first direction.

4. The memory device according to claim 1, wherein sidewalls of the bottom one of the plurality of first metal layers are aligned with sidewalls of the seed layer.

5. The memory device according to claim 1, further comprising:
   a first signal line;
   a bottom electrode over the first signal line, wherein the seed layer is disposed on the bottom electrode, and sidewalls of the seed layer are aligned with sidewalls of the bottom electrode.

6. The memory device according to claim 1, further comprising:
   a first signal line and a second signal line extending on different planes, wherein the seed layer is in contact with the first signal line, and the top electrode is electrically connected with the second signal line.

7. The memory device according to claim 1, further comprising:
   a dielectric layer surrounding the superlattice structure and the top electrode.

8. A memory device, comprising:
   a substrate;
   a plurality of seed layers over the substrate, wherein each seed layer comprises carbon and silicon;
   a plurality of superlattice structures, wherein each superlattice structure is directly disposed on and in contact with one corresponding seed layer, wherein each superlattice structure comprises a plurality of first metal layers and a plurality of second metal layers stacked alternately;
   a plurality of top electrodes, wherein each top electrode is located over one corresponding superlattice structure;
   a plurality of first signal lines extending along a first direction;
   a plurality of barrier layers disposed on and in contact with the first signal lines; and
   a plurality of bottom electrodes disposed on and in contact with the barrier layer, wherein each seed layer is disposed on and in contact with one corresponding bottom electrode, wherein the plurality of first signal lines, the plurality of barrier layers, the plurality of bottom electrodes, the plurality of seed layers, and the plurality of superlattice structures are stacked along a second direction perpendicular to the first direction.

9. The memory device according to claim 8, wherein each seed layer contains 3 wt % to 5 wt % silicon and 95 wt % to 97 wt % carbon.

10. The memory device according to claim 9, wherein the plurality of first metal layers are made of $Sb_2Te_3$, and the plurality of second metal layers are made of an alloy comprising Ge and Te, and a bottom one of the plurality of first metal layers in each superlattice structure is in contact with the one corresponding seed layer.

11. The memory device according to claim 8, wherein sidewalls of the plurality of superlattice structures are aligned with sidewalls of the plurality of seed layers.

12. The memory device according to claim 8, wherein sidewalls of the plurality of seed layers are aligned with sidewalls of the plurality of bottom electrodes.

13. The memory device according to claim 8, wherein a material of the plurality of bottom electrodes includes Ti, TiN, W, Cu, or Ru, and a material of the plurality of first signal lines includes AlCu, Cu, or Ru.

14. The memory device according to claim 8, further comprising:
a dielectric layer surrounding the plurality of superlattice structures and the plurality of top electrodes.

15. A fabrication method of a memory device, comprising:
forming a seed material layer over a substrate, wherein the seed material layer comprises carbon and silicon;
forming a plurality of first metal material layers and a plurality of second metal material layers above the seed material layer, wherein the plurality of first metal material layers and the plurality of second metal material layers are stacked alternately;
forming a top electrode material layer over a stack of the plurality of first metal material layers and the plurality of second metal material layers;
forming a plurality of hard masks over the top electrode material layer;
using the hard masks as a mask to perform a first etching process to pattern the top electrode material layer, the plurality of first metal material layers and the plurality of second metal material layers so as to form a plurality of top electrodes and a plurality of superlattice structures, wherein each superlattice structure comprises a plurality of first metal layers and a plurality of second metal layers stacked alternately, wherein the plurality of first metal layers are made of $Sb_2Te_3$, and the plurality of second metal layers are made of an alloy comprising Ge and Te; and
using the hard masks as a mask to perform a second etching process to pattern the seed material layer so as to form a plurality of seed layers, wherein the plurality of superlattice structures are in contact with the plurality of seed layers, wherein the seed layer comprises 95 wt % to 97 wt % carbon and 3 wt % to 5 wt % silicon, and a bottom one of the plurality of first metal layers in each superlattice structure is in contact with one corresponding seed layer.

16. The fabrication method according to claim 15, wherein the first etching process is performed by $CF_4$ plasma or $CHF_3$ plasma, and the second etching process is performed by $CH_4$ plasma, Ar plasma or $N_2$ plasma.

17. The fabrication method according to claim 15, wherein forming the hard mask over the top electrode material layer comprises:
forming a first hard mask material layer over the top electrode material layer;
forming a second hard mask material layer over the first hard mask material layer;
forming a patterned photoresist layer over the second hard mask material layer;
using the patterned photoresist layer as a mask to perform a third etching process to pattern the first hard mask material layer and the second hard mask material layer so as to form the plurality of hard masks, wherein each hard mask comprises a first hard mask layer and a second hard mask layer stacked with each other, wherein the third etching process is performed by halogen plasma; and
removing a residual patterned photoresist layer, then performing the first etching process.

18. The fabrication method according to claim 15, further comprising:
forming a plurality of first signal lines in a first dielectric layer; and
forming the seed material layer over the plurality of first signal lines and the first dielectric layer, and the seed material layer is in contact with the plurality of first signal lines.

19. The fabrication method according to claim 15, further comprising:
forming a plurality of first signal lines in a first dielectric layer;
forming a plurality of bottom electrodes in a second dielectric layer, wherein the plurality of bottom electrodes are located over the plurality of first signal lines, and the second dielectric layer is located over the first dielectric layer; and
forming the seed material layer over the plurality of bottom electrodes and the second dielectric layer, and the seed material layer is in contact with the plurality of bottom electrodes.

20. The fabrication method according to claim 15, further comprising:
forming a plurality of first signal lines in a first dielectric layer;
forming a bottom electrode material layer over the plurality of first signal lines and the first dielectric layer; and
forming the seed material layer over the bottom electrode material layer; and
using the hard masks as a mask to perform the second etching process to pattern the seed material layer and the bottom electrode material layer so as to form the plurality of seed layers and a plurality of bottom electrodes.

* * * * *